United States Patent
Tsen et al.

(10) Patent No.: US 7,951,615 B2
(45) Date of Patent: May 31, 2011

(54) SYSTEM AND METHOD FOR IMPLEMENTING MULTI-RESOLUTION ADVANCED PROCESS CONTROL

(75) Inventors: Andy Tsen, Chung-Ho (TW); Jin-Ning Sung, Pingjhen (TW); Po-Feng Tsai, Hsinpu Township, Hsinchu County (TW); Jong-I Mou, Hsinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 98 days.

(21) Appl. No.: 12/416,595

(22) Filed: Apr. 1, 2009

(65) Prior Publication Data
US 2010/0255613 A1    Oct. 7, 2010

(51) Int. Cl.
*H01L 21/66* (2006.01)
*G01R 31/26* (2006.01)

(52) U.S. Cl. ............ 438/14; 438/692; 438/700; 257/48; 257/E21.027; 257/E21.006; 257/E21.23; 257/E21.249; 257/E21.304; 257/E21.521; 257/E21.548

(58) Field of Classification Search .............. 438/14, 438/692, 700, 687, 738; 257/48, E21.027, 257/6, 23, 249, 304, 521, 548
See application file for complete search history.

(56) References Cited

U.S. PATENT DOCUMENTS

| | | | | |
|---|---|---|---|---|
| 6,957,177 | B1 * | 10/2005 | Brumitt et al. | 703/13 |
| 7,472,953 | B1 * | 1/2009 | Lalji | 297/224 |
| 7,818,797 | B1 * | 10/2010 | Fan et al. | 726/22 |
| 2005/0246155 | A1 * | 11/2005 | Brumitt et al. | 703/22 |

* cited by examiner

*Primary Examiner* — David Nhu
(74) *Attorney, Agent, or Firm* — Haynes and Boone, LLP

(57) ABSTRACT

One embodiment is a method for fabricating ICs from a semiconductor wafer. The method includes performing a first process on the semiconductor wafer; taking a first measurement indicative of an accuracy with which the first process was performed; and using the first measurement to generate metrology calibration data, wherein the metrology calibration data includes an effective portion and a non-effective portion. The method further includes removing the non-effective portion from the metrology calibration data and modeling the effective portion with a metrology calibration model; combining the metrology calibration model with a first process model to generate a multi-resolution model, wherein the first process model models an input-output relationship of the first process; and analyzing a response of the multi-resolution model and second measurement data to control performance a second process.

20 Claims, 3 Drawing Sheets

SYSTEM AND METHOD FOR IMPLEMENTING MULTI-RESOLUTION ADVANCED PROCESS CONTROL

BACKGROUND

The present disclosure relates generally to Advanced Process Control ("APC") as applied to integrated circuit ("IC") fabrication and, more particularly, to system and method for implementing a multi-resolution APC technique.

APC has become an essential component in semiconductor fabrication facilities ("fabs") for enabling continued improvement of device yield and reliability at a reduced cost. Significant elements of APC include integrated metrology, fault detection and classification, and run-to-run control. APC aids in reducing process variation as well as production costs. A key requirement for effective APC is that metrology tools are available to measure key parameters within an acceptable time frame. Additionally, methods must be provided for analyzing and interpreting measurement data. In practice, APC requires rich in-line measurements because the manufacturing processes are usually subjected to disturbance and drift caused by a variety of sources. Traditionally, APC has been based on constant or near-constant time sequence data inputs; however, it is recognized that the complexity of processes, tools, and products results in multiple data sources that impact the control performance with different time frequency. In general, an APC controller operates with disturbances from both the wafer and chamber conditions. The disturbances, which may include, for example, metrology bias, calibration offsets, and the like, may be of different resolutions. Moreover, some of the disturbances are effective, while others are not.

SUMMARY

One embodiment is a method for fabricating ICs from a semiconductor wafer comprising performing a first process on the semiconductor wafer; taking a first measurement indicative of an accuracy with which the first process was performed; and using the first measurement to generate metrology calibration data, wherein the metrology calibration data includes an effective portion and a non-effective portion. The method further comprises removing the non-effective portion from the metrology calibration data and modeling the effective portion with a metrology calibration model; combining the metrology calibration model with a first process model to generate a multi-resolution model, wherein the first process model models an input-output relationship of the first process; and analyzing a response of the multi-resolution model and second measurement data to control performance a second process.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to APC as applied to semiconductor fabrication and, more particularly, to system and method for implementing a multi-resolution APC. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Figure 1:
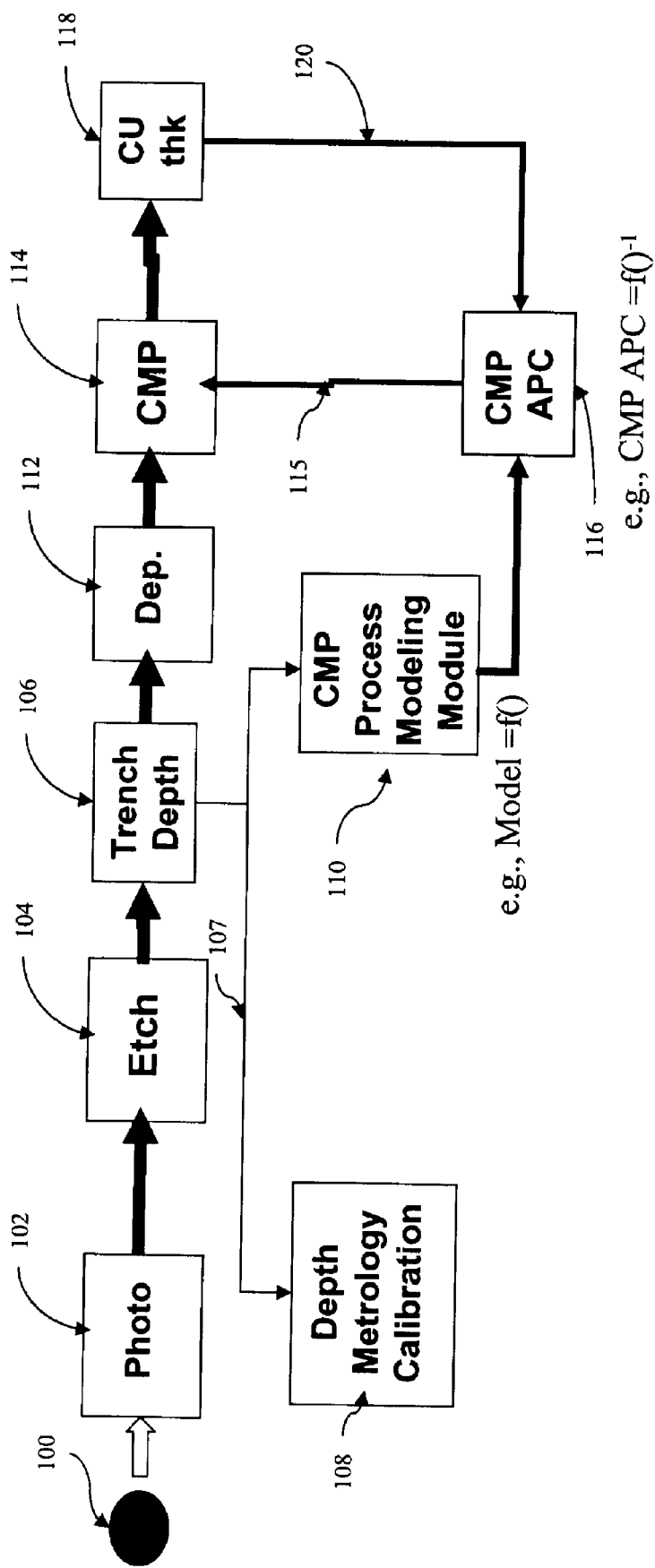
FIG. 1 illustrates a portion of a prior art process for fabricating ICs from semiconductor wafers.

FIG. 1 illustrates a portion of a prior art process for fabricating ICs from semiconductor wafers, such as a wafer 100. As shown in FIG. 1, a photolithography module 102 for performing a photolithography process on the wafer 100 in a conventional manner. Subsequently, an etch module 104 performs an etch process on the wafer 100 in a conventional manner. After the etch process has been performed, a trench depth measurement module 106 measures the depth of a trench etched by the module 104 and provides metrology data 107 to a depth metrology calibration module 108 and a CMP process modeling module 110 for purposes that will be described in greater detail below. Next, a deposition module 112 performs a deposition process on the wafer 100 in a conventional manner, after which a chemical-mechanical polish ("CMP") module 114 performs a CMP process on the wafer 100 in a conventional manner and in accordance with control signals 115 received from a CMP APC controller module 116. Finally, the thickness of the deposited copper ("CU") is measured by a module 118 and metrology data 120 is provided to the CMP APC controller module 116. It will be recognized that each of the modules 102-114, 116-118 includes processing, control, storage, display and/or input/output capabilities, as well as other equipment as necessary and appropriate to perform the respective functions thereof.

In the prior art embodiment illustrated in FIG. 1, the depth metrology calibration module 108 is used to monitor performance of the etch module 104. The metrology data 107, which is made available approximately 1-2 times per day, is used to update the CMP process model generated by the module 110, which models a relationship of the input and output of the process performed by the CMP module 114. In one embodiment, the CMP process model may be represented by a function f( ). For example, the CMP process model may model the amount of silicon removed as a function of silicon removal rate and time. The updated CMP process model and CU thickness data 120 are provided to the CMP APC controller 116, which evaluates the data 120 and the inverse of the process model (f( )$^{-1}$) and provides appropriate control signals to the CMP module 114 in a conventional manner.

Figure 2:
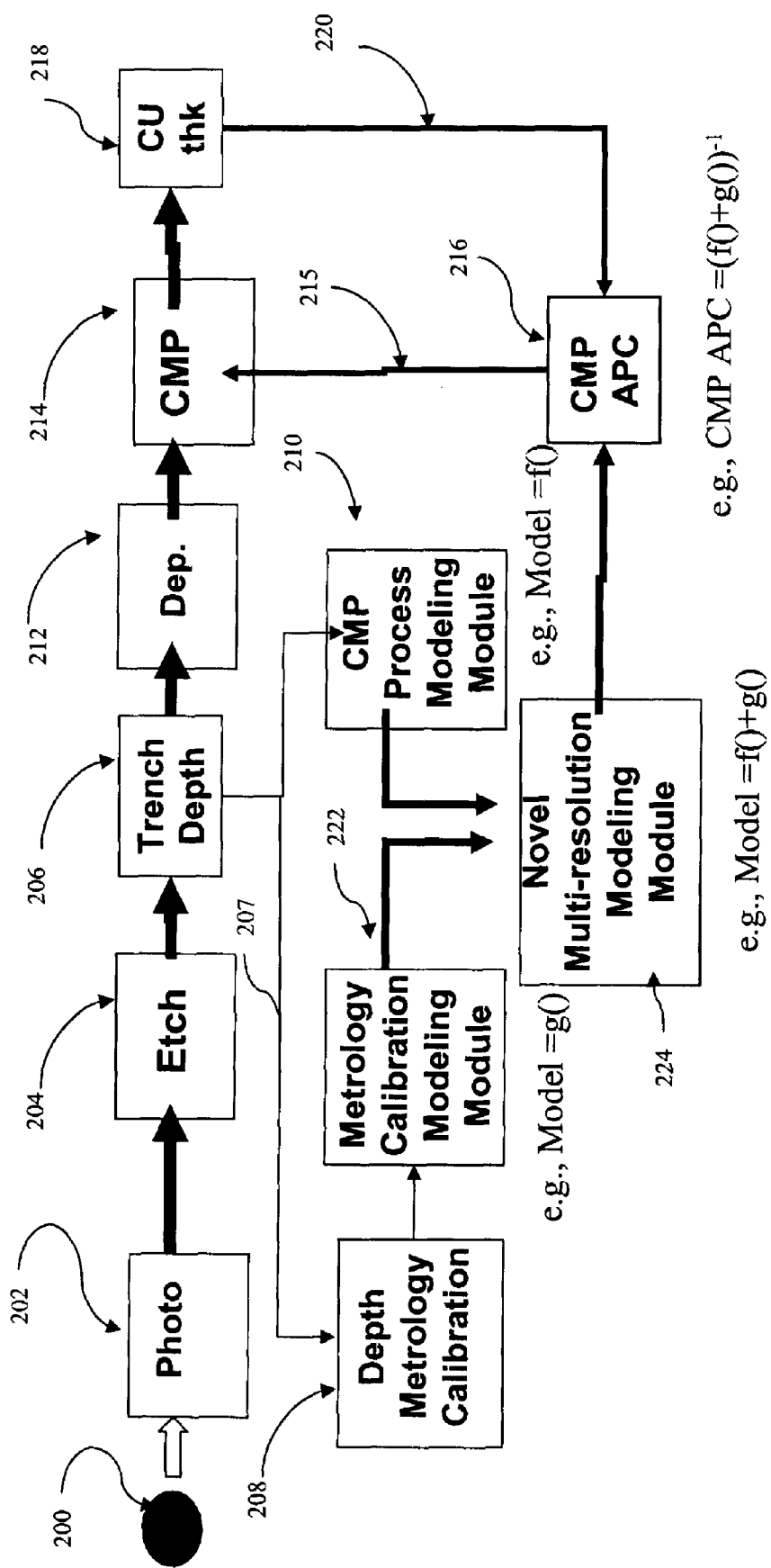
FIG. 2 illustrates a portion of a process for fabricating ICs from semiconductor wafers in accordance with embodiments described herein.

Turning now to FIG. 2, illustrated therein is a portion of an IC fabrication system for fabricating ICs from semiconductor wafers, such as a wafer 200, in accordance with embodiments described herein. In some respects, the process illustrated in FIG. 2 is similar to the one illustrated in FIG. 1. In particular, the process shown in FIG. 2 includes a photolithography module 202 for performing a photolithography process on the wafer 200 in a conventional manner. Subsequently, an etch module 204 performs an etch process on the wafer 200 in a conventional manner. After the etch process has been performed, a trench depth measurement module 206 measures the depth of a trench etched by the module 204 and provides metrology data 207 to a depth metrology calibration module 208 and a CMP process modeling module 210 for purposes that will be described in greater detail below. Next, a deposition module 212 performs a deposition process on the wafer 200 in a conventional manner, after which a chemical-mechanical polish ("CMP") module 214 performs a CMP process on the wafer 100 in a conventional manner and in accordance with control signals 215 received from a CMP APC controller module 216. Finally, the thickness of the deposited copper ("CU") is measured by a module 218 and metrology data 220 is provided to the CMP APC controller module 216.

In the embodiment illustrated in FIG. 2, the depth metrology calibration module 208 is used to monitor performance of the etch module 204. The metrology data 207 is used to update the CMP process model from the module 210, which models a relationship of the input and output of the process performed by the CMP module 214. For example, the CMP process model may model the amount of silicon removed as a function of silicon removal rate and time and may be represented as a function f( ).

In IC fabrication practice, the APC controller operates with a different disturbance from the wafer and chamber condition. These disturbance sources contain different resolutions, such as metrology bias, calibration offset, and others. In the embodiment illustrated in FIG. 2, these disturbances are classified as effective or non-effective to enhance the effectiveness of the APC controller, as will be described in detail below.

Figure 3:
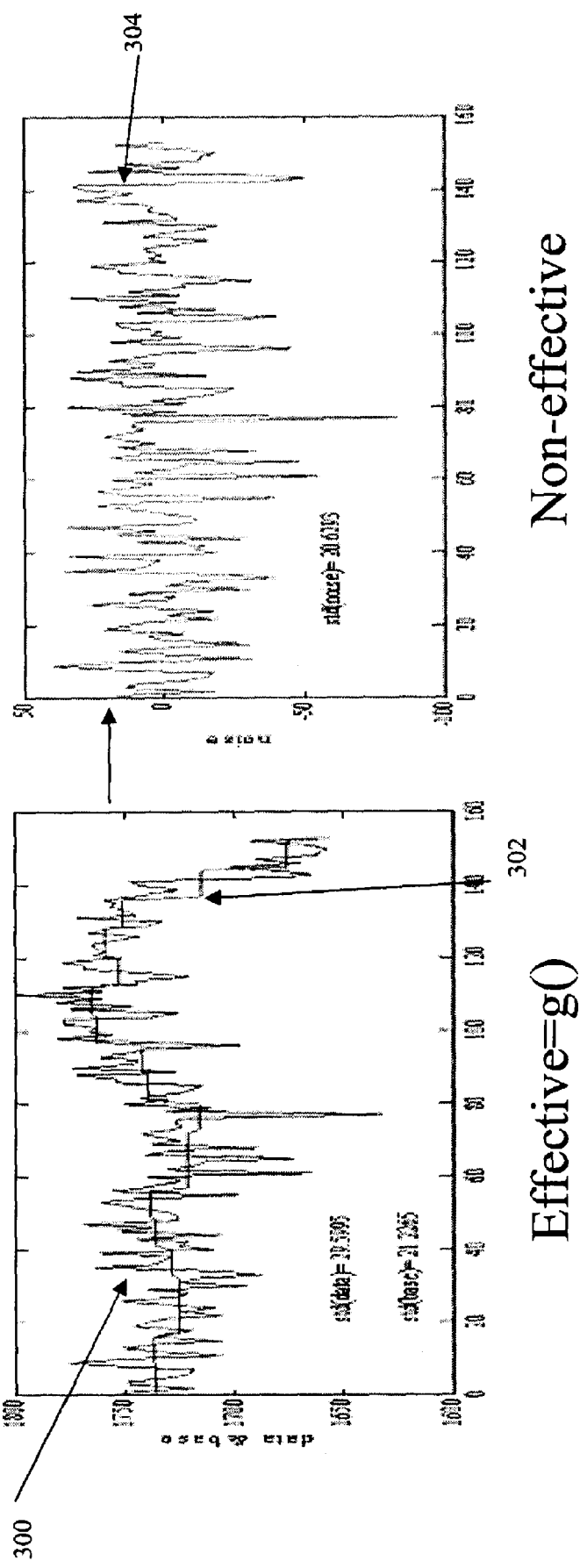
FIG. 3 illustrates graphs of depth metrology calibration data associated with the process of FIG. 2.

Specifically, in accordance with features of a novel embodiment described herein, the IC fabrication system of FIG. 2 includes a metrology calibration modeling module 222 and a multi-resolution modeling module 224 for purposes that will be described in greater detail below. In particular, the metrology calibration modeling module 222 receives depth metrology calibration data 224 from the depth metrology calibration module 208, which data is made available approximately 1-2 times per day; that is, it is low frequency data. Referring to FIG. 3, exemplary depth metrology calibration data 300 is represented as a function of data & base over time. It will be recognized that the data 300 includes an effective portion 302, which is representative of actual tool performance, and a non-effective portion 304 comprising mostly noise. The metrology calibration modeling module removes the non-effective portion 304 from the data 300, leaving only the effective portion 302, which is modeled as a function g( ). It will be recognized that the removal of the non-effective portion of the data can be performed in a variety of manners, including, but not limited to, using a Fourier transform or multi-resolution analysis ("MRA").

Referring again to FIG. 2, the CMP process model from the module 210 and the metrology calibration model from the module 222 are provided to the multi-resolution modeling module 224, which combines the two models to create a multi-resolution model represented as a function f( )+g( ). The updated multi-resolution model and CU thickness data 220 are provided to the CMP APC controller 216, which evaluates the data 220 and the inverse of the model 210 (e.g., (f( )+g( ))$^{-1}$) and provides appropriate control signals to the CMP module 214. It will be recognized that each of the modules 202-214. 216-218 includes processing, control, storage, and input/output capabilities, as well as other equipment necessary for performing the functions described with respect thereto.

Although only a few exemplary embodiments of this invention have been described in detail above, those skilled in the art will readily appreciate that many modifications are possible in the exemplary embodiments without materially departing from the novel teachings and advantages of this invention.

It is understood that various different combinations of the above-listed embodiments and steps can be used in various sequences or in parallel, and there is no particular step that is critical or required. Moreover, each of the modules depicted in the drawings can be implemented on multiple devices, including computing devices, and implementation of multiple ones of the depicted modules may be combined into a single device, including a computing device. Furthermore, features illustrated and discussed above with respect to some embodiments can be combined with features illustrated and discussed above with respect to other embodiments. Accordingly, all such modifications are intended to be included within the scope of this invention.

What is claimed is:

1. A method for fabricating ICs from a semiconductor wafer, the method comprising:
   performing a first process on the semiconductor wafer;
   taking a first measurement indicative of an accuracy with which the first process was performed;
   using the first measurement to generate metrology calibration data, wherein the metrology calibration data includes an effective portion and a non-effective portion;
   removing the non-effective portion from the metrology calibration data and modeling the effective portion with a metrology calibration model;
   combining the metrology calibration model with a first process model to generate a multi-resolution model, wherein the first process model models an input-output relationship of the first process; and
   analyzing a response of the multi-resolution model and second measurement data to control performance of a second process.

2. The method of claim 1 wherein the removing comprises performing multi-resolution analysis ("MRA") on the calibration data to separate the effective portion from the non-effective portion.

3. The method of claim 1 wherein the first process comprises an etching process.

4. The method of claim 1 wherein the first measurement comprises trench depth.

5. The method of claim 1 wherein the second process comprises a chemical mechanical polish ("CMP") process and the second measurement comprises copper thickness.

6. The method of claim 5 wherein the analyzing is performed by a CMP advanced process control ("APC") module.

7. The method of claim 1 wherein the process model represents an amount of substrate removed as a function of removal rate and time and the metrology calibration model represents a tool bias.

8. A system for fabricating ICs from a semiconductor wafer, the system comprising:
   means for performing a first process on the semiconductor wafer;
   means for taking a first measurement indicative of an accuracy with which the first process was performed;
   means for using the first measurement to generate metrology calibration data, wherein the metrology calibration data includes an effective portion and a non-effective portion;

means for removing the non-effective portion from the metrology calibration data and for modeling the effective portion as a metrology calibration model;

means for combining the metrology calibration model with a first process model to generate a multi-resolution model, wherein the first process model models an input-output relationship of the first process; and means for analyzing a response of the multi-resolution model and second measurement data to control performance of a second process.

9. The system of claim 8 wherein the means for removing comprises means for performing multi-resolution analysis ("MRA") on the calibration data to separate the effective portion from the non-effective portion.

10. The system of claim 8 wherein the first process comprises an etching process.

11. The system of claim 8 wherein the first measurement comprises trench depth.

12. The system of claim 8 wherein the second process comprises a chemical mechanical polish ("CMP") process and the second measurement comprises copper thickness.

13. The system of claim 12 wherein the analyzing is performed by a CMP advanced process control ("APC") module.

14. The system of claim 8 wherein the process model represents an amount of substrate removed as a function of removal rate and time and the metrology calibration model represents a tool bias.

15. A system for implementing a multi-resolution APC in a semiconductor fabrication process, the system comprising:

a first process tool for performing a first process on the semiconductor wafer;

a first metrology tool for obtaining first measurement data indicative of an accuracy with which the first process was performed;

a metrology calibration module for generating metrology calibration data using the first measurement data, wherein the metrology calibration data includes an effective portion and a non-effective portion;

a metrology calibration modeling module for removing the non-effective portion from the metrology calibration data and for modeling the effective portion as a metrology calibration model;

a multi-resolution modeling module for combining the metrology calibration model with a first process model to generate a multi-resolution model, wherein the first process model models an input-output relationship of the first process; and an APC controller for analyzing a response of the multi-resolution model and second measurement data to control performance of a second process.

16. The system of claim 15 wherein the metrology calibration modeling module performs the removing by performing multi-resolution analysis ("MRA") on the calibration data to separate the effective portion from the non-effective portion.

17. The system of claim 15 wherein the first process comprises an etching process and the first measurement comprises trench depth.

18. The system of claim 15 wherein the second process comprises a chemical mechanical polish ("CMP") process and the second measurement comprises copper thickness.

19. The system of claim 18 wherein the APC module is a CMP APC module.

20. The system of claim 15 wherein the process model represents an amount of substrate removed as a function of removal rate and time and the metrology calibration model represents a tool bias.

* * * * *